(12) United States Patent
Grant

(10) Patent No.: US 7,545,033 B2
(45) Date of Patent: *Jun. 9, 2009

(54) LOW COST POWER SEMICONDUCTOR MODULE WITHOUT SUBSTRATE

(75) Inventor: William Grant, Fountain Valley, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/495,107

(22) Filed: Jul. 28, 2006

(65) Prior Publication Data

US 2006/0261463 A1  Nov. 23, 2006

Related U.S. Application Data

(62) Division of application No. 10/635,359, filed on Aug. 6, 2003, now Pat. No. 7,122,890, which is a division of application No. 09/758,822, filed on Jan. 11, 2001, now Pat. No. 6,703,703.

(60) Provisional application No. 60/175,802, filed on Jan. 12, 2000.

(51) Int. Cl.
*H01L 23/10* (2006.01)
*H01L 23/34* (2006.01)

(52) U.S. Cl. ............... 257/706; 257/707; 257/E23.079; 257/E23.103

(58) Field of Classification Search .......... 257/680, 257/688, 689, 698, 700, 706, 724, 707, E23.079, 257/E23.103
See application file for complete search history.

(56) References Cited

U.S. PATENT DOCUMENTS

| | | | |
|---|---|---|---|
| 3,936,864 A | 2/1976 | Benjamin | |
| 4,172,261 A | 10/1979 | Tsuzuki et al. | |
| 4,649,416 A | 3/1987 | Borkowski et al. | |
| 4,695,858 A | 9/1987 | Takezawa et al. | |
| 4,985,753 A | 1/1991 | Fujioka et al. | |
| 5,001,299 A | 3/1991 | Hingorany | |
| 5,036,381 A | 7/1991 | Lin | |
| 5,258,647 A | 11/1993 | Wojnarowski et al. | |
| 5,315,486 A | 5/1994 | Fillion et al. | |
| 5,371,405 A * | 12/1994 | Kagawa | 257/664 |
| 5,559,374 A | 9/1996 | Ohta et al. | |

(Continued)

FOREIGN PATENT DOCUMENTS

DE 3916899 11/1990

(Continued)

OTHER PUBLICATIONS

Cancellation Proceedings for Decision of Appeal on May 2, 2006 for Appeal Case No. 2004-1932—Japanese Application No. 2001-005156.

*Primary Examiner*—Ngan Ngo
(74) *Attorney, Agent, or Firm*—Ostrolenk, Faber, Gerb & Soffen, LLP

(57) ABSTRACT

A power module for low voltage applications, which does not include an insulated metal substrate is disclosed. The module includes a power shell and a plurality of lead frames each lead frame including a conductive pad on which one or more MOSFETs may be electrically mounted. The MOSFETs are electrically connected via wire bonds.

14 Claims, 4 Drawing Sheets

U.S. PATENT DOCUMENTS

| | | |
|---|---|---|
| 5,677,567 A | 10/1997 | Ma et al. |
| 5,744,752 A | 4/1998 | McHerron et al. |
| 6,105,226 A | 8/2000 | Gore et al. |
| 6,313,598 B1 | 11/2001 | Tamba et al. |

FOREIGN PATENT DOCUMENTS

| | | |
|---|---|---|
| EP | 0 774 782 A2 | 5/1997 |
| JP | 6283639 | 10/1994 |
| JP | 10093015 | 4/1998 |
| JP | 11274358 | 10/1999 |
| JP | 2001085613 | 3/2001 |

* cited by examiner

LOW COST POWER SEMICONDUCTOR MODULE WITHOUT SUBSTRATE

RELATED APPLICATIONS

This application is a divisional of U.S. patent application Ser. No. 10/635,359, filed Aug. 6, 2003, entitled Low Cost Power Semiconductor Module Without Substrate which is a divisional of U.S. patent application Ser. No. 09/758,822, filed Jan. 11, 2001 by William Grant, now U.S. Pat. No. 6,703,703 entitled Low Cost Power Semiconductor Module Without Substrate which application relates and claims priority to a U.S. provisional application, Ser. No. 60/175,802, entitled Low Cost Power Semiconductor Module Without Substrate, filed in the United States Patent and Trademark Office on Jan. 12, 2000.

BACKGROUND OF THE INVENTION

This invention relates to power modules and more specifically relates to a low cost 3 phase inverter module which has no substrate for the power semiconductor die.

Power semiconductor modules are well known and are widely used. Typically, a plurality of semiconductor die, such as MOSgated devices, thyristors or diodes in various combinations are mounted on a substrate heartsick, such as an IMS (insulated metal substrate) or other substrate and are electrically connected through the substrate, and/or by wire bonds, to form a particular circuit. A printed circuit board containing low power control components is also supported by the module. Power and control terminals may then extend from an insulation housing which carries the substrate.

Substrates used to carry the power die constitute a significant part of the cost of power modules, and therefore they are limited to the smallest possible area. It would be desirable to reduce the cost of such modules while permitting appropriate thermal management and electrical insulation.

SUMMARY OF THE INVENTION

In accordance with the invention, the power die are mounted directly on lead frame extensions of a lead frame which is insert molded within and supported by the module insulation housing. A heat conductive insulation layer underlies the lead frame elements to insulate it from a heat sink support for the module. No added IMS or other substrate is used, thus reducing the cost of the module.

In a preferred embodiment, the module is a three phase inverter circuit for automotive application for example, for electric power steering motors. However, any other desired circuit can be provided.

DETAILED DESCRIPTION OF THE DRAWINGS

Figure 8:
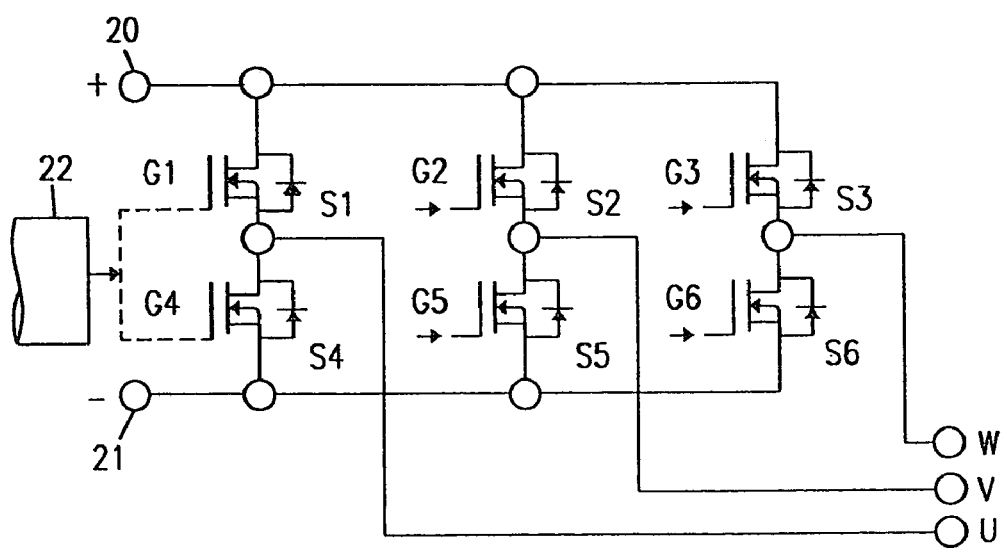
FIG. 8 is a circuit diagram of an exemplary module circuit which can be formed by the module.
Figure 7:
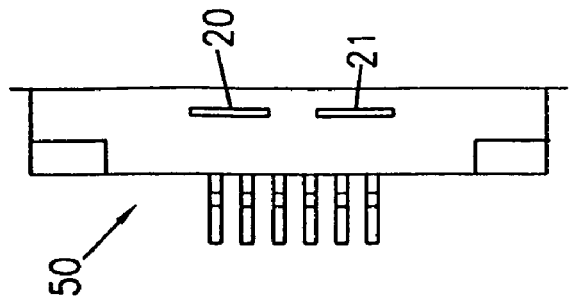
FIG. 7 is an end view of FIG. 5.
Figure 5:
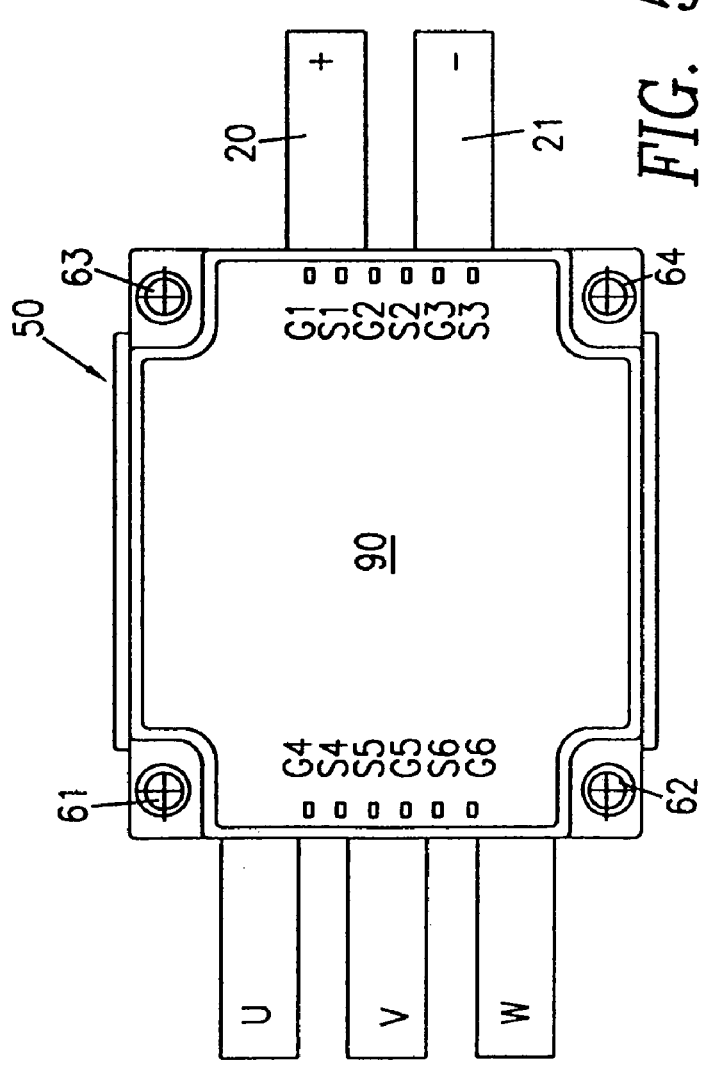
FIG. 5 is a top view of the module of FIG. 4.
Figure 6:
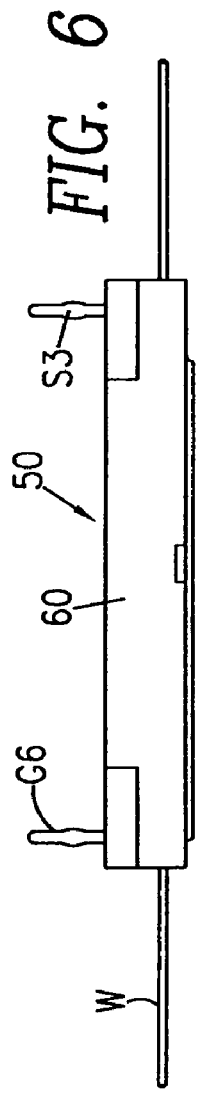
FIG. 6 is a side view of FIG. 5.

Referring first to FIG. 8, there is shown an exemplary electrical circuit diagram of a 3 phase inverter circuit which could have application to automotive uses particularly to electric power steering. Thus, terminals 20 and 21 are d-c terminals which could be connected to the automobile battery and output terminals U, V and W are 3 phase output terminals which can be used to power ac motors, or, with suitable rectification, dc motors, such as dc brushless motors, that are typically found within the automotive system. A conventional three phase inverter circuit is shown. An ASIC and other control circuit components for the MOSFETs $S_1$ to $S_6$ may also be provided to operate power MOSFETS $S_1$ to $S_6$ in a conventional sequence. The instant invention is particularly suited for low voltage applications. The die of the present invention are rated from 30 to 75 volts and are size 4.0 to 6 die as sold by the International Rectifier Corporation. Higher or lower voltage rates may also be used. For example, voltage rates of up to 1000 volts, or as low as 10 volts may be used.

While power MOSFETs $S_1$ to $S_6$ are shown as N channel devices, complementary N and P channel MOSFETs could be used.

In conventional modules, the circuit of FIG. 8 is commonly formed by employing unpackaged MOSFET die which are mounted on an IMS or DBC substrate and interconnected through the substrate and by wire bonds. The substrate would then be mounted within an insulation housing and terminals, such as the terminals 20, 21, U, V, W and $G_{1\ to\ G6}$ would extend beyond the housing surface to be available for connection.

The substrate used to mount the die within the housing according to conventional modules is expensive. In accordance with the invention, this substrate is eliminated, with the die mounted directly on the lead frame extensions of the terminals. Note that any circuit other than an inverter can be formed, and that any type of die or mix of die, such as N and P channel MOSFETs or IGBTs, diodes, thyristors and the like can be used and enjoy the benefits of the invention.

FIGS. 1 to 7 show a preferred embodiment of the invention for housing the 3 phase inverter circuit of FIG. 8. Note that the same identifying numeral or letter is used in all drawings to identify the same part.

Figure 1:
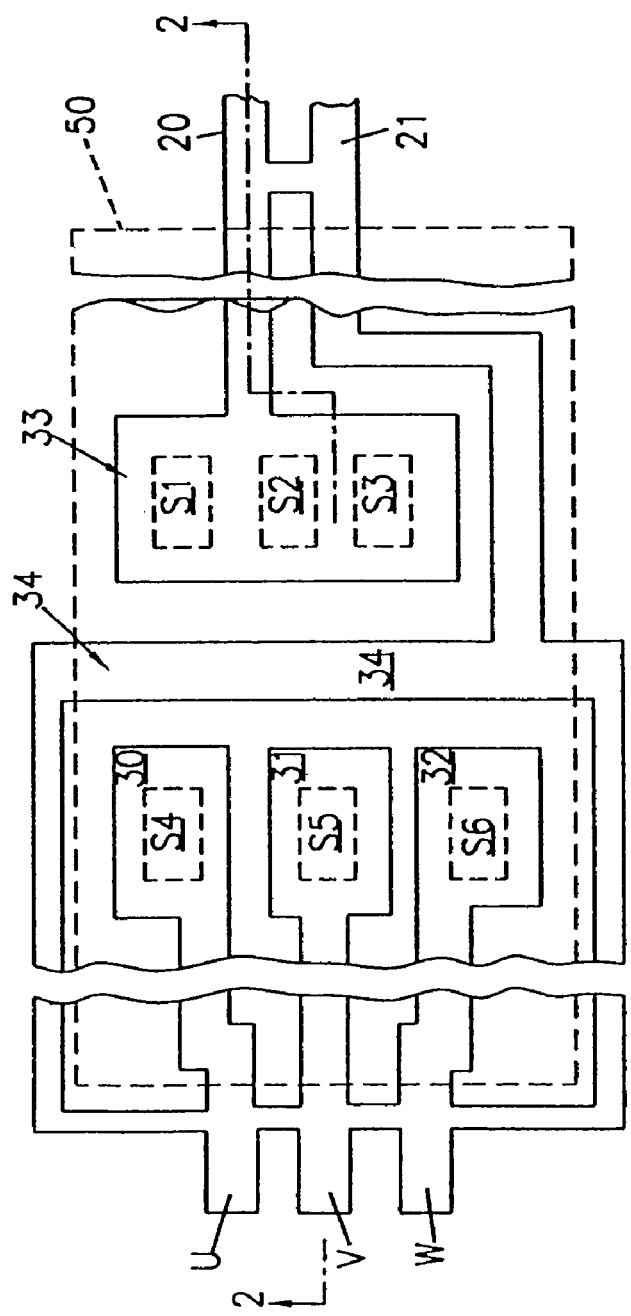
FIG. 1 is a top view of a lead frame which can be used with the present invention.
Figure 2:
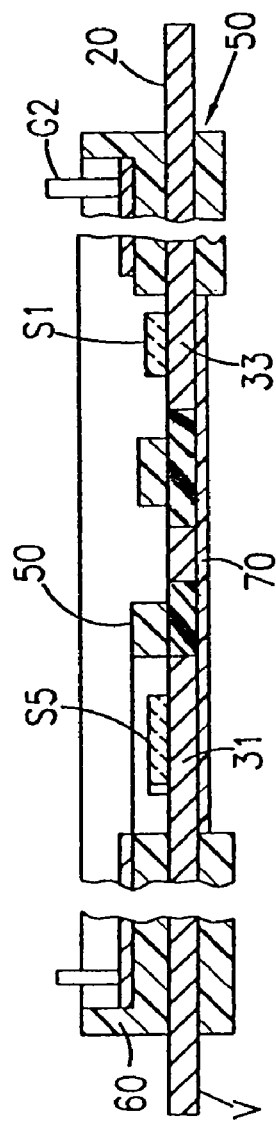
FIG. 2 is a cross-section of the lead frame of FIG. 1 taken across section line 2-2 in FIG. 1 as incorporated in a module according to the present invention.

FIG. 1 shows one segment of an elongated conductive, stamped lead frame which can be used with the invention. A plurality of such segments are provided in the usual manner. The various segments of the lead frame are held together by webs which will be stamped out after parts are mounted on the lead frame and wire bonded and the lead frame segments are singulated. One half of the lead frame provides terminals U, V and W which are connected to large pad areas 30, 31 and 32 respectively. These pads 30, 31 and 32 will receive the MOSFET die S4, S5 and S6 respectively. The other half of the lead frame has terminals 20 and 21 and a common drain pad 33. Terminal 21 is also connected to a source pad area 34. Die S1, S2 and S3 are connected to pad 33. Die S1 to S6 are vertical conduction MOSFET die having metallized bottom drain electrodes and a top source and gate electrode. The bottom drain electrodes may be soldered or otherwise connected, as by a silver loaded conductive epoxy, to the enlarged lead frame pad regions 30, 31, 32 and 33.

Figure 3:
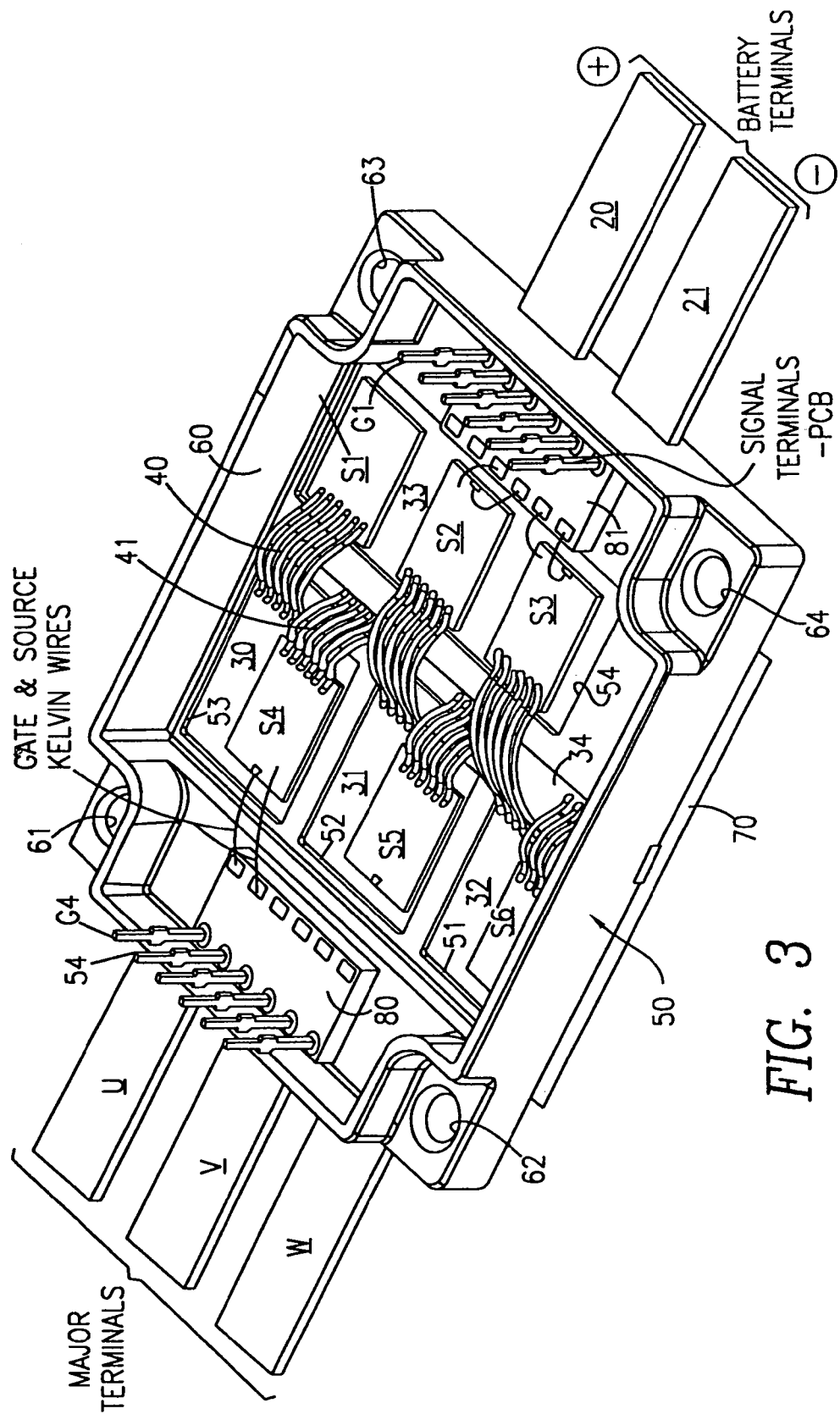
FIG. 3 is a perspective view of the module of the invention, before its interior is sealed with insulation plastic.
Figure 4:
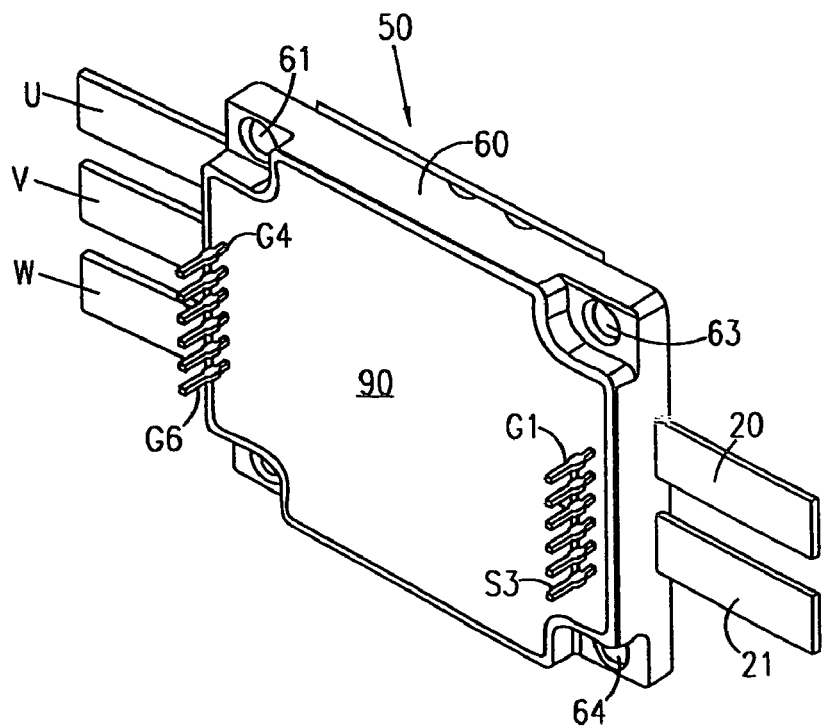
FIG. 4 is another perspective view of the module of the invention after its interior is filled.

After the die S1 to S6 are fixed in place, they may be wire bonded, as shown in FIG. 3 to complete the circuit of FIG. 8.

Thus, as shown in FIG. 3, source bond wires 40 connect the pads 30, 31 and 32 to the source electrodes of die S1, S2 and S3 respectively; and source bond wires 41 connect the source electrodes of die S4, S5 and S6 to pad 34 and d-c terminal 21. Note that these bonds can be made after mounting of the lead frame in its housing.

Thus, after the die S1 to S6 are bonded to their various lead frame pads, the lead frame is insert molded in an insulation housing 50 and the lead frame bridging sections (exterior of the dotted line in FIG. 1) are removed to separate the leads from one another and the lead frames are thus singulated.

Alternatively, the lead frame may be first insert molded in the insulation housing 50, and the lead frame bridging sections removed, thereby singulating the leads from one another. Then, the die S1 to S6 may be bonded to their various lead frame pads, and wire bonded to one another.

In either case, the lead frames are supported by the housing 50 after lead frame trimming, with conductors U, V, W, 20 and 21 extending beyond the periphery of housing 50. Housing 50 may be preferably a thermally conductive insulation material which can electrically isolate conductive lead frame pads and a heat sink, on which the module may be mounted, from one another. The housing 50 need not, however, be made from thermally conductive material to reduce the cost of the module. For example, housing 50 may be a QUESTRA plastic made by DOW chemical, or a suitable PPA such as the one made by Amoco and sold under the mark AMODEL.

Housing 50 will have windows 51, 52, 53 and 54 to expose the top surfaces of pads 32, 31, 30 and 33 respectively to provide access to die S1 to S6 for the die bonding operation. A rim 60 is integral with and surrounds the housing 50 and bolt-down openings 61, 62, 63, 64 are provided at the housing corners. A bottom layer 70 of a thin insulation material extends fully across the bottom of the housing 50 and acts to electrically isolate the pads 30, 31, 32, 33 and 34 from one another and from the users heat sink on which the housing is mounted. Note that lead frame pads act to conduct thermal energy generated by the die S1 to S6 through the lead terminals and to the thermally conductive insulation layer, which may be placed in contact with a heat sink. A large percentage of the thermal energy is dissipated through the thermally conductive insulation layer, and the remainder may be dissipated through the lead terminals.

As next shown in FIG. 3 printed circuit boards 80 and 81 which carry control terminals G1 to G6 (FIGS. 4 and 5) and related Kelvin (source) terminals and wire bond terminals therefor are fixed to the top opposite platform end surfaces of the housing 50 and appropriate wire bonds can be made.

After all wire bonds are made, the interior of rim 60 of housing 50 may be filled by a suitable silastic (FIGS. 4 and 5), or an epoxy or the like.

A separation means 90 may then be disposed over the rim. The separation means may be rigid, and may allow the terminals to pass through. The separation means may be a blank circuit board that is capable of receiving electronic components. A circuit board containing components for the control of the inverter circuit may then be disposed over the separation means 90. Due to its rigidity, the separation means keeps the terminals aligned for engagement with the circuit board containing the control components.

Note that the module of FIGS. 1 to 7 has no separate substrate for receiving the die S1 to S6 and, therefore has a reduced expense.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

I claim:

1. A power module comprising:
   a support housing;
   a heatsink;
   thermally conductive and electrically insulating body in contact with said heatsink; and
   a lead frame molded in and supported by said support housing, said lead frame including a plurality of spaced conductive pads each unitarily formed with a respective lead that extends from a respective conductive pad to the exterior of said support housing, each conductive pad including a top surface for receiving a power semiconductor switch and an opposing bottom surface in contact with said thermally conductive and electrically insulating body, whereby a portion of heat generated by each said power semiconductor switch is transmitted through said thermally conductive and electrically insulating body and another portion of heat generated by each said power semiconductor switch is transmitted through a respective lead and dissipated outside said support housing, wherein spaces between said conductive pads are filled by portions of said support housing, wherein at least one of said leads is electrically connectable to a power bus to supply power to a connected power semiconductor switch and at least another one of said leads is used as an output external connection.

2. A power module according to claim 1, wherein said support housing comprises a molded rim surrounding said conductive pad, and said leads extend through said rim to the exterior thereof.

3. A power module according to claim 1, wherein at least one of said power semiconductor switches is electrically connected to at least another one of said semiconductor switches to form a power circuit.

4. A power module according to claim 1, further comprising an external lead electrically connected to a common conductive pad disposed within said support housing and electrically connectable to a common bus, wherein at least one of said power semiconductor switches is electrically connected to said common conductive pad.

5. A power module according to claim 1, wherein a plurality of power semiconductor switches are disposed on one common conductive pad, and each remaining conductive pad includes one power semiconductor switch and further comprising a conductive bar isolated from said one common conductive pad and said remaining conductive pads, said isolated conductive bar being disposed between said one common conductive pad and said remaining conductive pads.

6. A power module according to claim 5, wherein said external lead connected to said one common conductive pad is connectable to a power bus to supply power to said power semiconductor switches disposed thereon, said leads connected to said remaining conductive pads serve as output leads and said lead connected to said conductive bar serves as a connection to ground.

7. A power module according to claim 6, wherein at least one of said power semiconductor switches disposed on said one common conductive pad is electrically connected to a respective one of said remaining pads by at least one wire bond, and each of said power semiconductor switches is connected to said isolated conductive bar by at least one wire bond.

8. A power module according to claim 1, further comprising a plurality of pins each electrically connected to a control electrode of a respective power semiconductor switch and extending from an interior of said support housing to an exterior thereof for electrical connection.

9. A power module according to claim 8, wherein a number of said pins are disposed on a first circuit board adjacent said isolated conductive pads and the remaining pins are disposed on a second circuit board adjacent said at least one conductive pad.

10. A power module according to claim 1, further comprising at least one circuit board disposed inside said support housing and including at least one pin electrically connected to a conductive land, said conductive land being electrically connected to the control electrode of a power semiconductor switch.

11. A power module according to claim 10, further comprising a circuit board disposed over said support housing, wherein said at least one pin extends through said circuit board for connection to a control circuit for controlling the operation of said power semiconductor switch.

12. A power module according to claim 6, wherein said leads connected to said remainder conductive pads extend from one side of said support housing and said lead connected to said one common conductive pad and said external lead connected to said isolated conductive bar extend from an opposing side of said support housing.

13. A power module according to claim 1, wherein said power semiconductor switches are power MOSFETs.

14. A power module according to claim 1, wherein said thermally conductive and electrically insulating body is comprised of a sil pad.

* * * * *